United States Patent [19]
Sukegawa

[11] Patent Number: 5,673,383
[45] Date of Patent: Sep. 30, 1997

[54] STORAGE SYSTEM WITH A FLASH MEMORY MODULE

[75] Inventor: Hiroshi Sukegawa, Tokyo, Japan

[73] Assignee: Kabushiki Kaisha Toshiba, Kawasaki, Japan

[21] Appl. No.: 670,098

[22] Filed: Jun. 25, 1996

Related U.S. Application Data

[63] Continuation of Ser. No. 481,156, Jun. 7, 1995, Pat. No. 5,559,956, which is a continuation of Ser. No. 1,750, Jan. 7, 1993, abandoned.

[30] Foreign Application Priority Data

Jan. 10, 1992 [JP] Japan .......................................... 4-3368
Sep. 14, 1992 [JP] Japan .......................................... 4-244713

[51] Int. Cl.$^6$ .................................................................. G06F 11/00
[52] U.S. Cl. ..................................... 395/182.06; 371/10.2
[58] Field of Search .............................. 395/425, 182.06, 395/182.05, 182.03; 371/10.2

[56] References Cited

U.S. PATENT DOCUMENTS

| | | | |
|---|---|---|---|
| 4,752,871 | 6/1988 | Sparks et al. ............................ | 364/200 |
| 5,053,990 | 10/1991 | Kriefels et al. ........................... | 364/900 |
| 5,155,835 | 10/1992 | Belsan ..................................... | 395/425 |
| 5,172,338 | 12/1992 | Mahrotra et al. ......................... | 365/185 |
| 5,200,959 | 4/1993 | Gross et al. ............................. | 371/21.6 |
| 5,210,854 | 5/1993 | Beaverton et al. ....................... | 395/500 |
| 5,263,003 | 11/1993 | Cowles et al. ........................... | 365/230.03 |
| 5,268,870 | 12/1993 | Harari ..................................... | 365/218 |
| 5,270,979 | 12/1993 | Harari et al. ............................. | 365/218 |
| 5,297,148 | 3/1994 | Harari et al. ............................. | 371/10.2 |
| 5,303,198 | 4/1994 | Adachi et al. ............................ | 365/218 |

FOREIGN PATENT DOCUMENTS 58-215794 12/1983 Japan .

OTHER PUBLICATIONS

"4 parts Semiconductor Disc Device using Flash EEPROM-Optimiation of Small-Type Personal Computer For External Storage," Eli Harari Sun Disk Corp., NIKKEI Electronics, No. 547, pp. 165 and 167, 1992.

*Primary Examiner*—Robert W. Beausoliel, Jr.
*Assistant Examiner*—Norman M. Wright
*Attorney, Agent, or Firm*—Finnegan, Henderson, Farabow, Garrett & Dunner, L.L.P.

[57] ABSTRACT

In a storage system using flash EEPROMs, a memory module is composed of a plurality of memory blocks arranged in units of in-unison erase blocks. Some of the memory blocks are used as management tables storing management information for managing address allocation of each memory block and the number of rewrites for each memory block. A memory controller reads the management information from the management table at the system start-up, and based on the management information, controls the read/write access to each memory block.

33 Claims, 19 Drawing Sheets

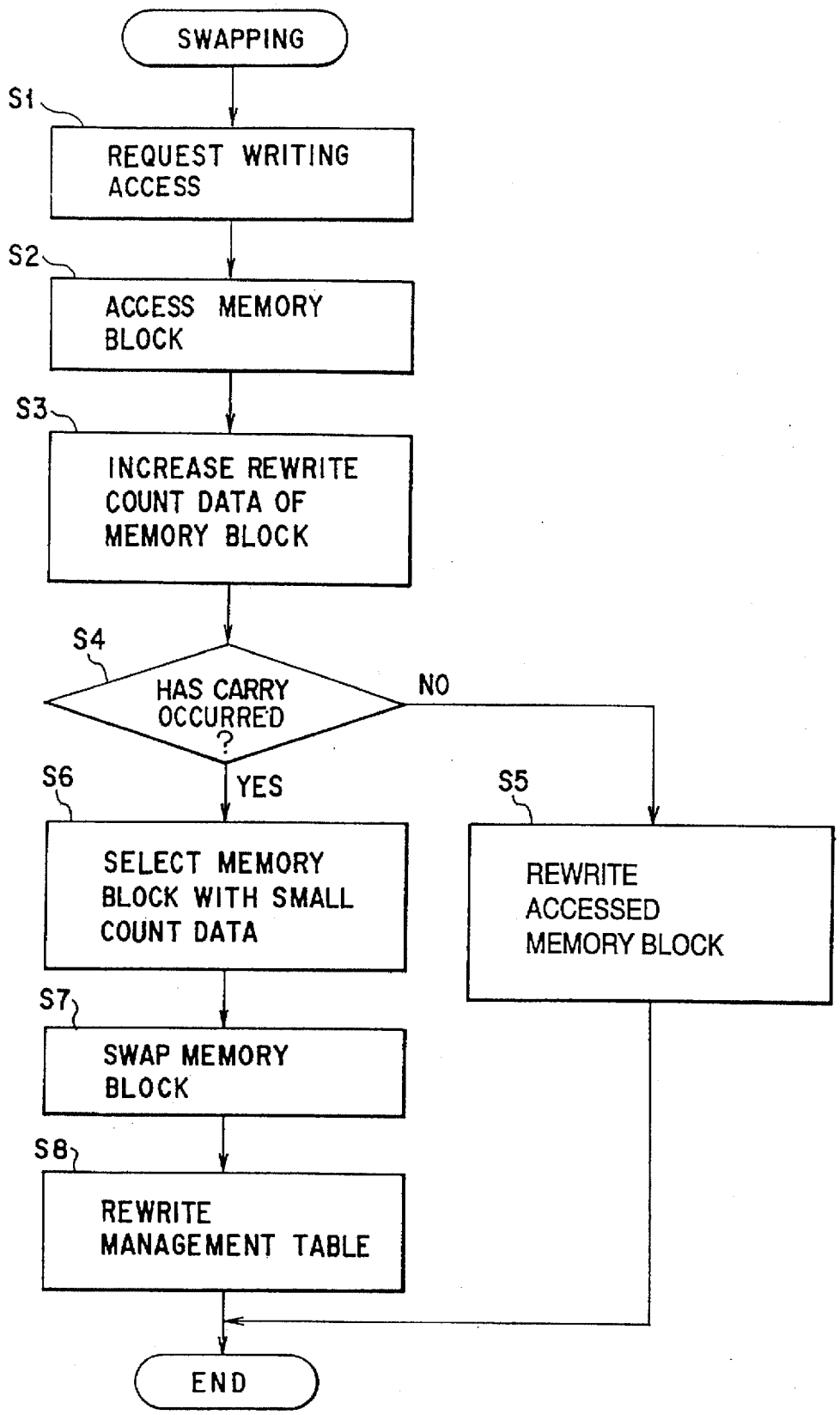
F I G. 4

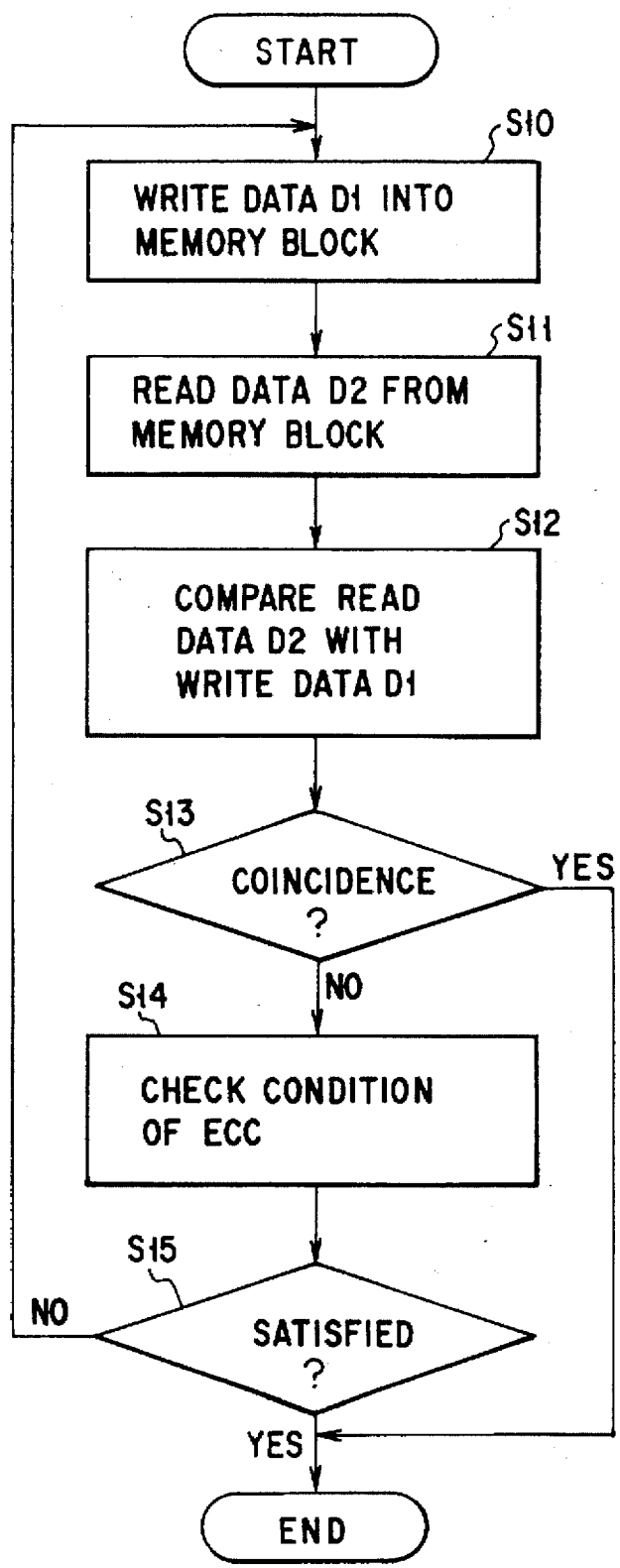
F I G. 5

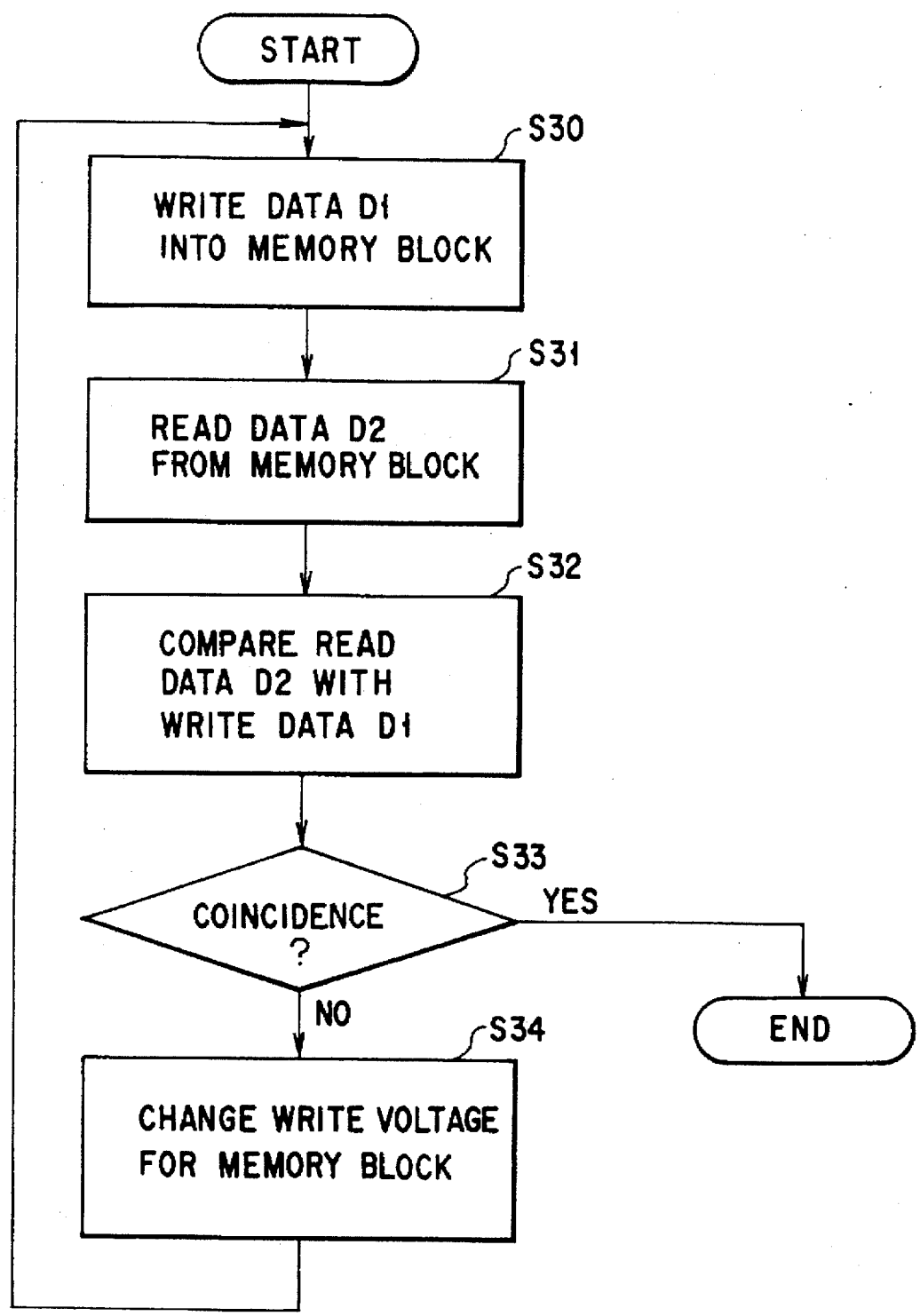
F I G. 8

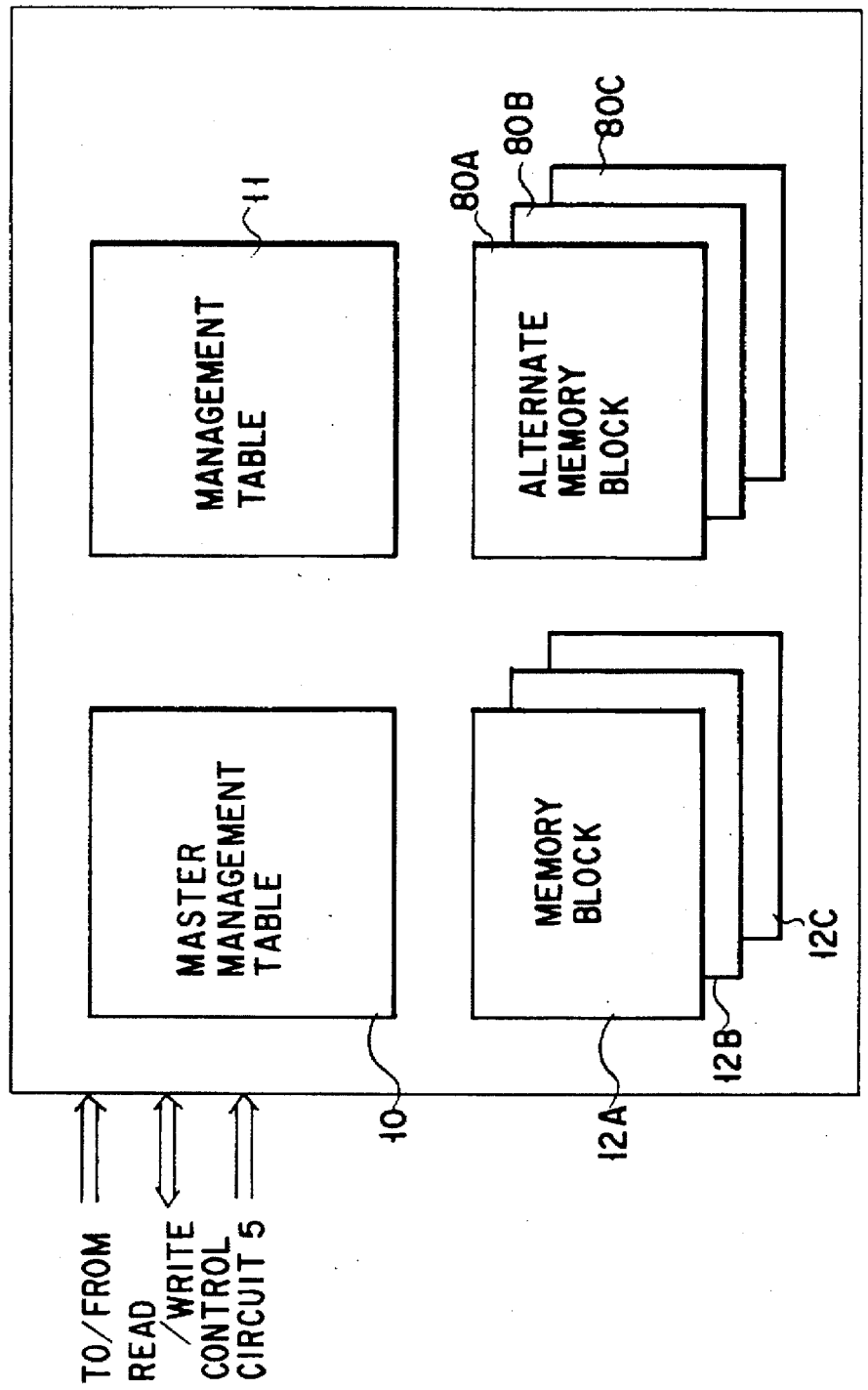
F I G. 13

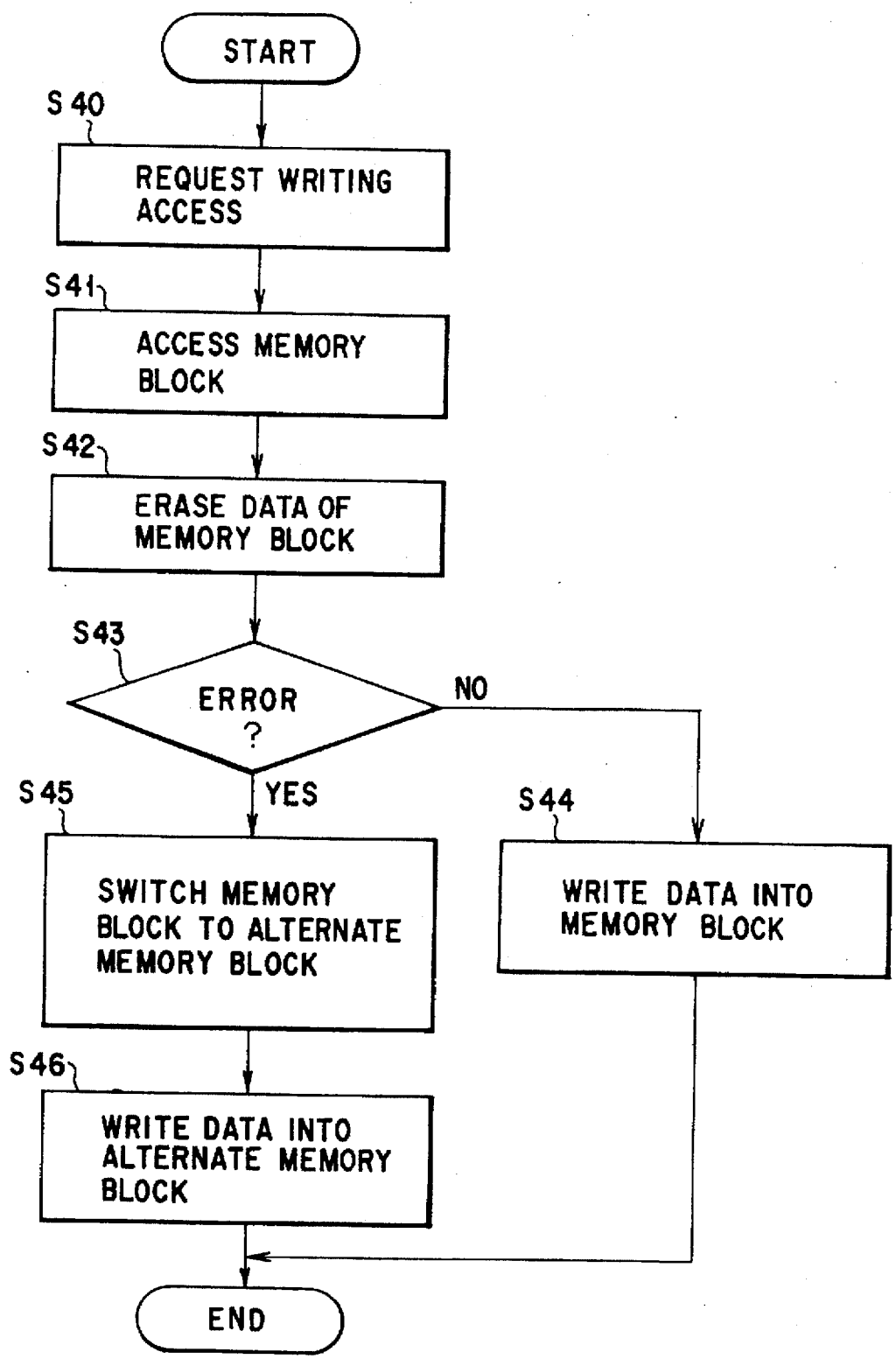
F I G. 14

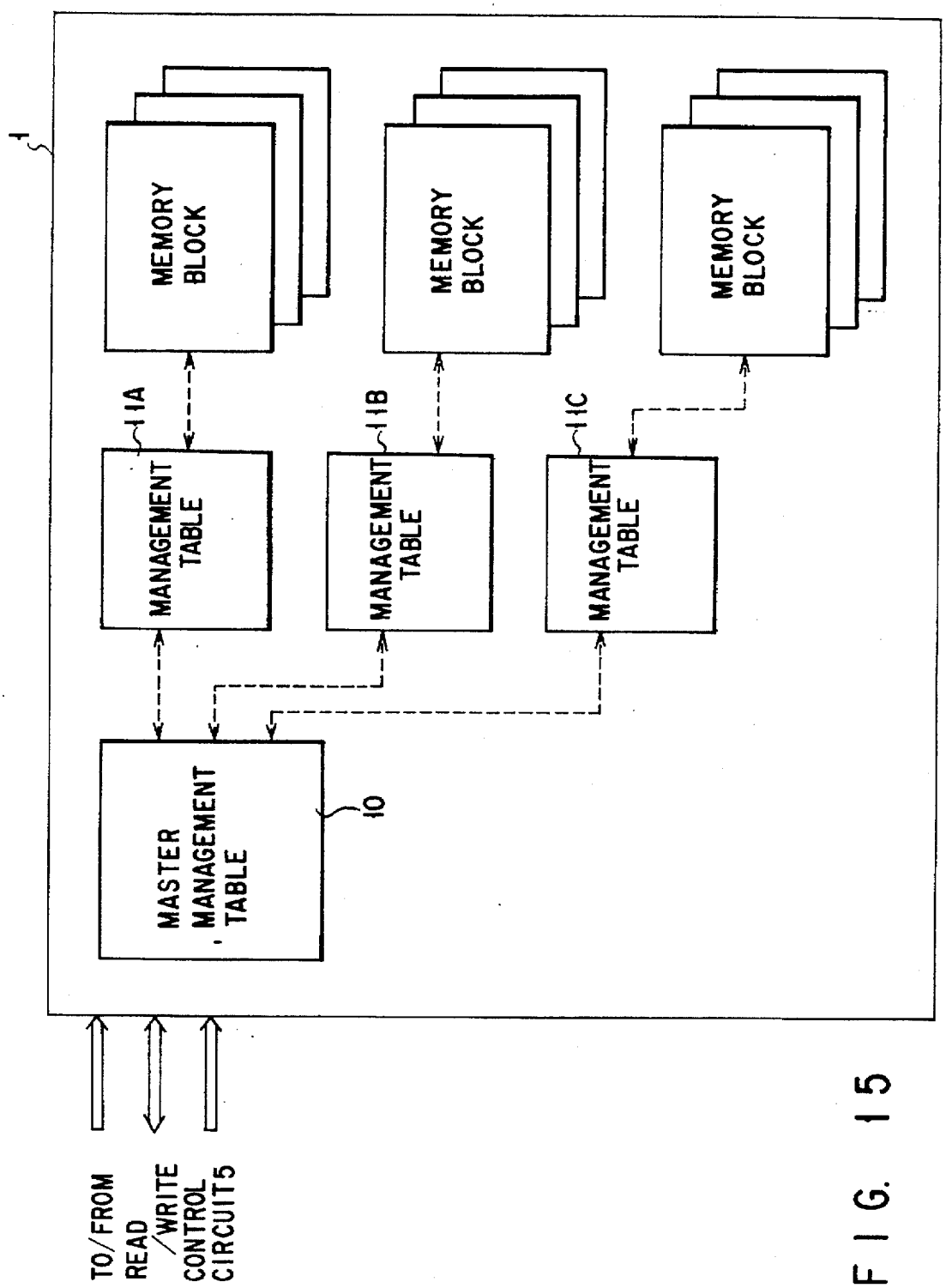
F I G. 15

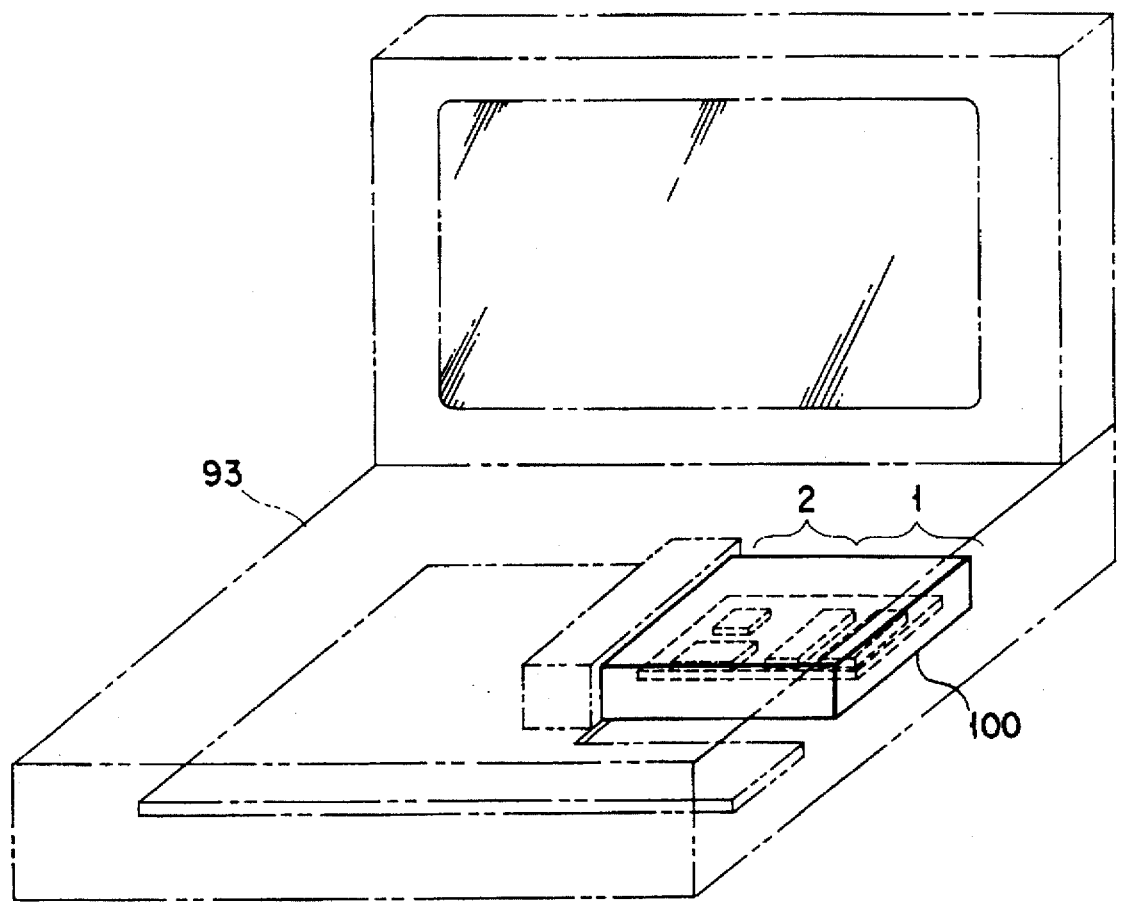
F I G. 19

STORAGE SYSTEM WITH A FLASH MEMORY MODULE

This is a continuation of application. Ser. No. 08/481,156, filed Jun. 7, 1995, now U.S. Pat. No. 5,559,956, which is a continuation of application Ser. No. 08/001,750, filed Jan. 7, 1993, now abandoned.

BACKGROUND OF THE INVENTION

1. Field of the Invention

This invention relates to a storage system with a flash memory module using flash EEPROMs as memory elements, and more particularly to a storage system constituting a silicon disk unit used as an external memory device for a computer system.

2. Description of the Related Art

Flash EEPROMs (electrically erasable and programmable read-only memories) are rewritable nonvolatile memory elements that can be erased over the entire chip or in blocks. There are EEPROMs known to be similar to flash EEPROMs. EEPROMs, which are electrically erasable, differ from flash EEPROMs in that the former are erased in bytes.

Unlike EEPROMs, flash EEPROMs do not require a data erase driving circuit for each memory cell, which allows a construction of a single transistor per memory cell. They, therefore, provide a high packing density like other semiconductor memory devices such as DRAMs and mask ROMs.

Flash EEPROMs are characterized by being rewritable but has the disadvantage that there is a limit to the number of possible rewrites. Specifically, data writing may grow more difficult as it is used further, and eventually impossible. Data writing and erasing are done by applying a high voltage such as 12 V or 20 V to inject charges into or extract charges from the floating gate. In the data write operation, to equalize the cell potentials after writing, a high voltage is generally applied in small time divisions until a specified potential is reached, while the write verify operation is being executed on each memory cell.

Recently, storage systems have been developed which employ flash EEPROMs for an external memory device, called a silicon disk unit, for a computer system. Those storage systems are broadly divided into two types: one type is such that a host system recognizes write information in file form, and writes data into flash EEPROMs in a manner that distinguishes file management information from the contents of files, and the other type is such that a host system does not particularly recognize write information but uses the storage system as an external storage device like a conventional hard disk drive (HDD).

With those types, flash EEPROMs can be used as external storage devices, but there is still a limit to the number of possible rewrites in flash EEPROMs as noted earlier. This creates the problem that when the host system writes data in the external memory system, rewrites can concentrate on a particular block of the flash EEPROMs (an in-unison erase block unit), which makes it impossible to rewrite, thereby leading to a serious reduction in the service life of the entire system. With the first type, it is possible to alleviate the concentration of rewrites on a particular block by causing the host system to select a file storage location. To do this, however, the host system needs software to manage the number of rewrites, thereby falling short of universality.

Additionally, when the host system accesses the external storage system, address allocation management is necessary which converts logical addresses in the host system into physical addresses in blocks of flash. EEPROMs. Conventionally, because the host system must perform the address allocation management, the system without address allocation management software cannot handle such a memory system, thus leading to lack of universality as mentioned above.

SUMMARY OF THE INVENTION

An object of the present invention is to prevent a situation where rewrites concentrate on a particular block of flash EEPROMs, without management by the host system, in a storage system that uses flash EEPROMs as an external memory system for a computer system.

Another object of the present invention is to provide a storage system that can be accessed by logical addresses in the host system like an ordinary external storage system, without address allocation by the host system.

The foregoing objects are accomplished by providing a storage system comprising: a memory module composed of a plurality of memory blocks arranged in units of in-unison erase blocks; memory management means composed of memory management memory blocks, selected from each of the memory blocks, which store management information that manages address allocation of each of the memory blocks; and memory controller means which executes memory control in a manner that, based on the management information stored in the memory management memory block, reads the data at the address specified by the host system from a memory block of the flash memory module, or writes specified data in the memory block corresponding to the specified address. It further comprises rewrite count data memory means which stores the rewrite count data for each memory block updated when data is rewritten. The memory management means stores management information that manages the rewrite frequency for each memory block on the basis of the rewrite count data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a flowchart for explaining a swapping process associated with the embodiment;

FIGS. 5 and 6 are each flowcharts for explaining a write verify process associated with the embodiment;

FIG. 8 is a flowchart for explaining the write voltage-changing process in connection with the embodiment;

FIG. 13 is a block diagram showing the construction of an alternative memory block in connection with the embodiment;

FIG. 14 is a flowchart for explaining a substituting process in connection with the embodiment;

FIG. 15 is a block diagram showing the construction of a plurality of management tables in connection with the embodiment;

FIG. 19 is a perspective view showing an outward appearance of a personal computer which is the system body associated with the embodiment.

DETAILED DESCRIPTION OF THE PREFERRED EMBODIMENTS

Referring to the accompanying drawings, a storage system according an embodiment of the present invention will be explained hereinafter.

Basic Configuration of the System

Figure 1:
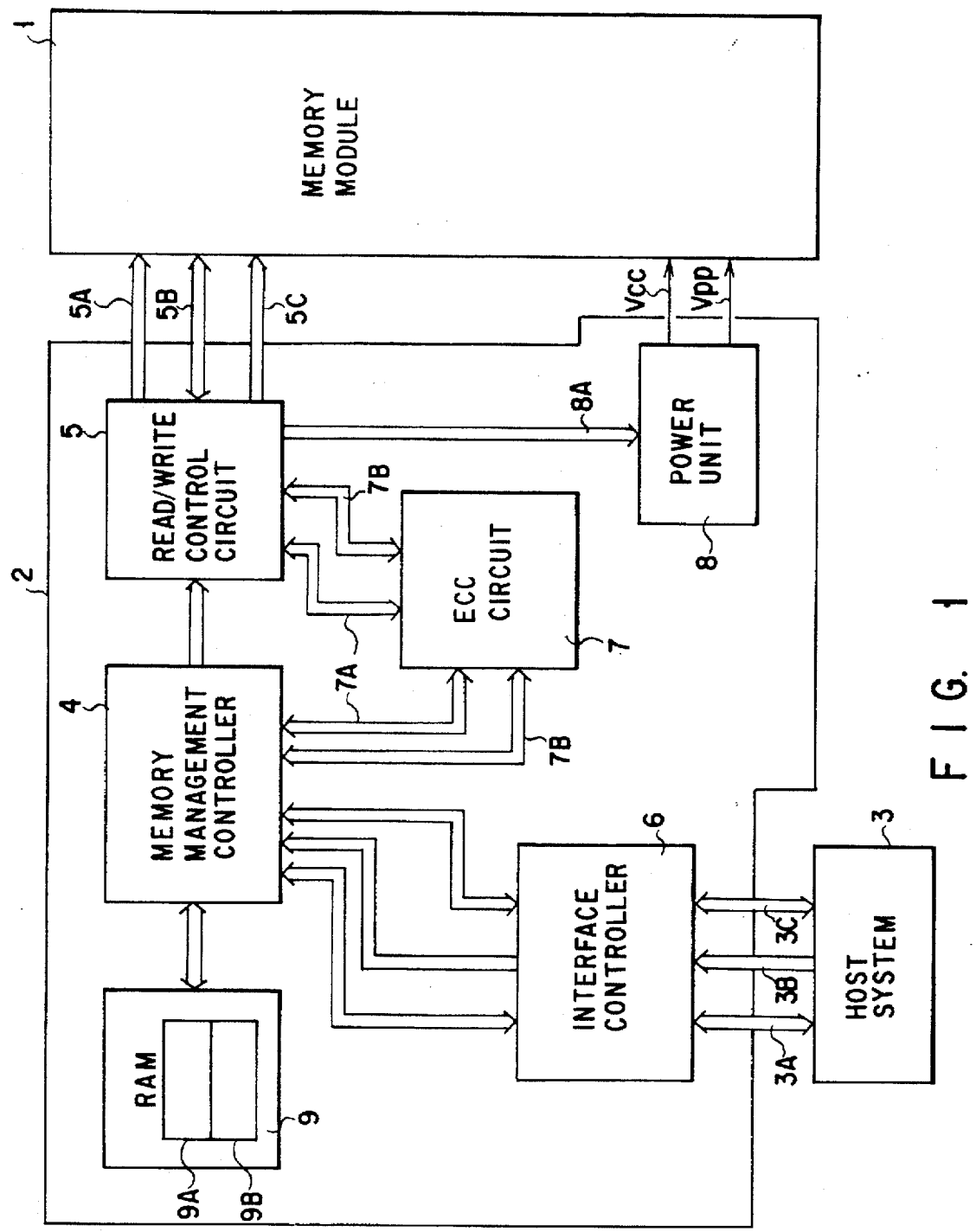
FIG. 1 is a block diagram showing the construction of a storage system according to an embodiment of the present invention.

This storage system, as shown in FIG. 1, is composed of a memory module 1 made up of flash EEPROMs, a memory controller unit 2, and a host system 3. The memory module 1 is a storage system body for storing and retrieving data in response to access by the host system 3 under the control of the controller unit 2.

The controller unit 2, which is connected to the host system 3 by a data bus 3A, an address bus 3B, and a command bus 3C, transmits and receives data, addresses, and commands.

The controller unit 2 contains a memory management controller 4, a read/write control circuit 5, an interface controller 6, an ECC (error checking and correcting) circuit 7, a power supply unit 8, and a RAM (random access memory) 9.

The interface controller 6, which is connected to the host system 3 by the data bus 3A, address bus 3B, and command bus 3C, controls the transfer of data, addresses,.and commands to and from the host system 3. The read/write control circuit 5, which is connected to the memory module 1 by an address bus 5A, a data bus 5B and a control signal bus 5C, performs read/write control of the memory module 1. The control circuit 5 has the function of executing the write verify process and the write voltage-changing process in the write mode.

The memory management controller 4, according to the memory management information stored in the RAM 9, executes various memory management processes including the address conversion process, swapping process, memory management information update process, judgment process of memory module 1's using state, and substituting process of memory blocks. The RAM 9, which is accessed by the memory management controller 4, is a memory for storing the copies 9A and 9B of a master management table and a management table (see FIG. 2A) provided in the memory module 1. The address conversion process is a process in which the logical address specified by the host system 3 is converted into a physical address used for accessing the memory module 1.

The ECC circuit 7, which is connected to the memory management controller 4 and read/write control circuit 5 by a data bus 7A and an address bus 7B, respectively, executes an error checking and correcting process in the data read mode and during the write verify process. The power supply unit 8, which has a power supply circuit for supplying a power supply voltage necessary for the read/write operation of the memory module 1, supplies a read voltage Vcc and a write/erase voltage Vpp to the memory module 1. The power supply unit 8 is provided with a power supply controller that changes the write/erase voltage Vpp according to the command supplied via the command bus 8A from the read/write control circuit 5.

The memory module 1 is composed of a plurality of memory blocks of flash EEPROMs arranged in specified units of in-unison erase blocks. In this invention, the memory blocks are divided into a particular memory block used as a master management table 10 that contains master management information, a selected memory block used as a management table 11 that contains memory management information, and a plurality of memory blocks 12A through 12C that store data accessed for writing by the host system 3.

Figure 2A:
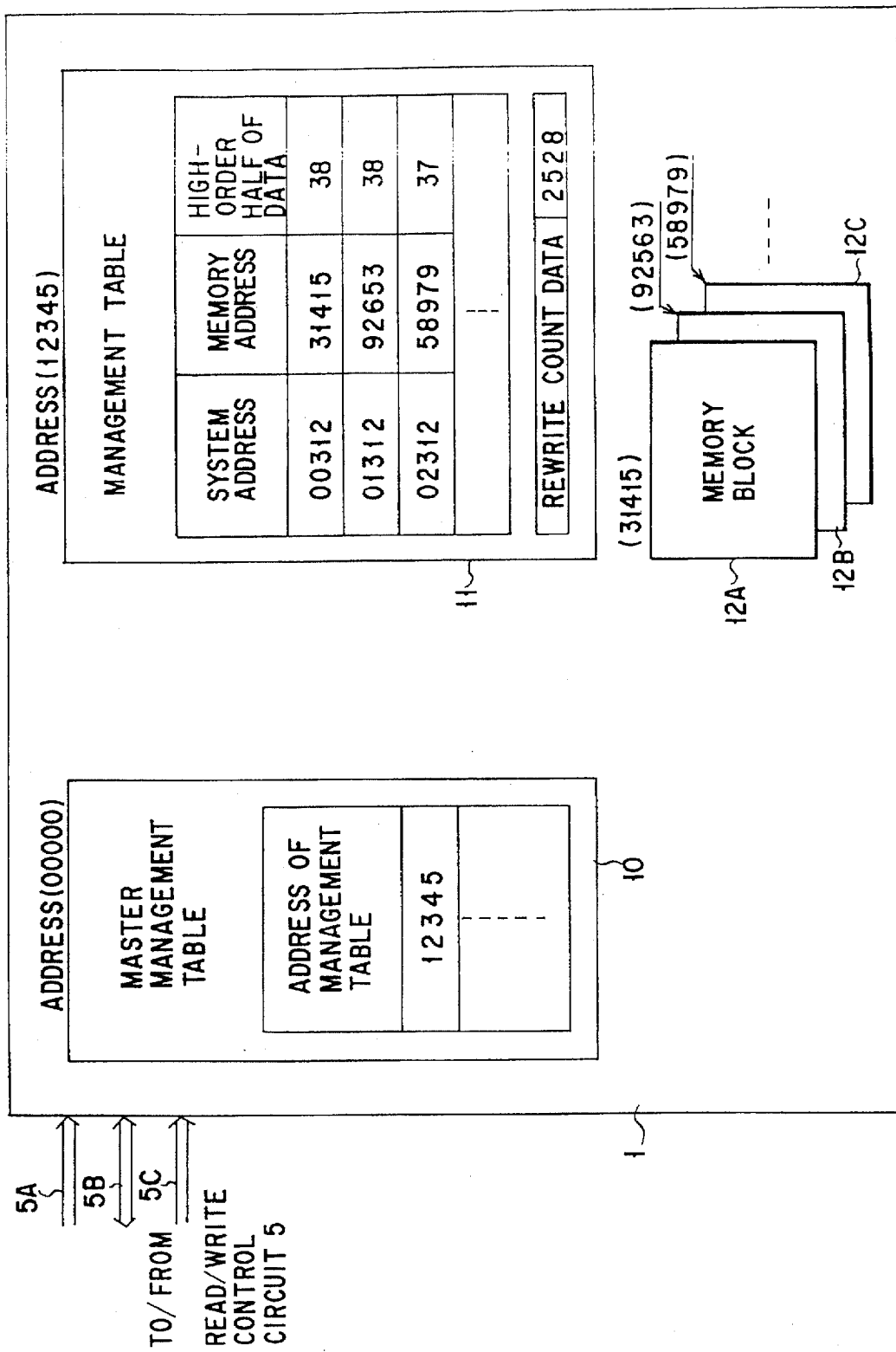
FIGS. 2A, 2B, and 2C are block diagrams showing a construction of a memory module in connection with the embodiment.
Figure 2B:
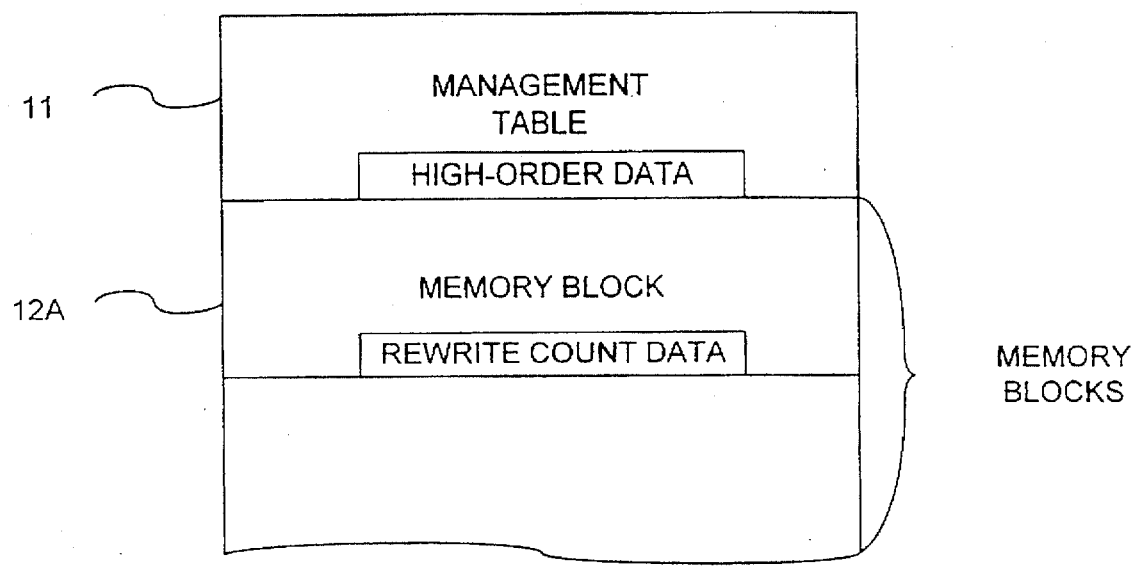
Figure 2C:
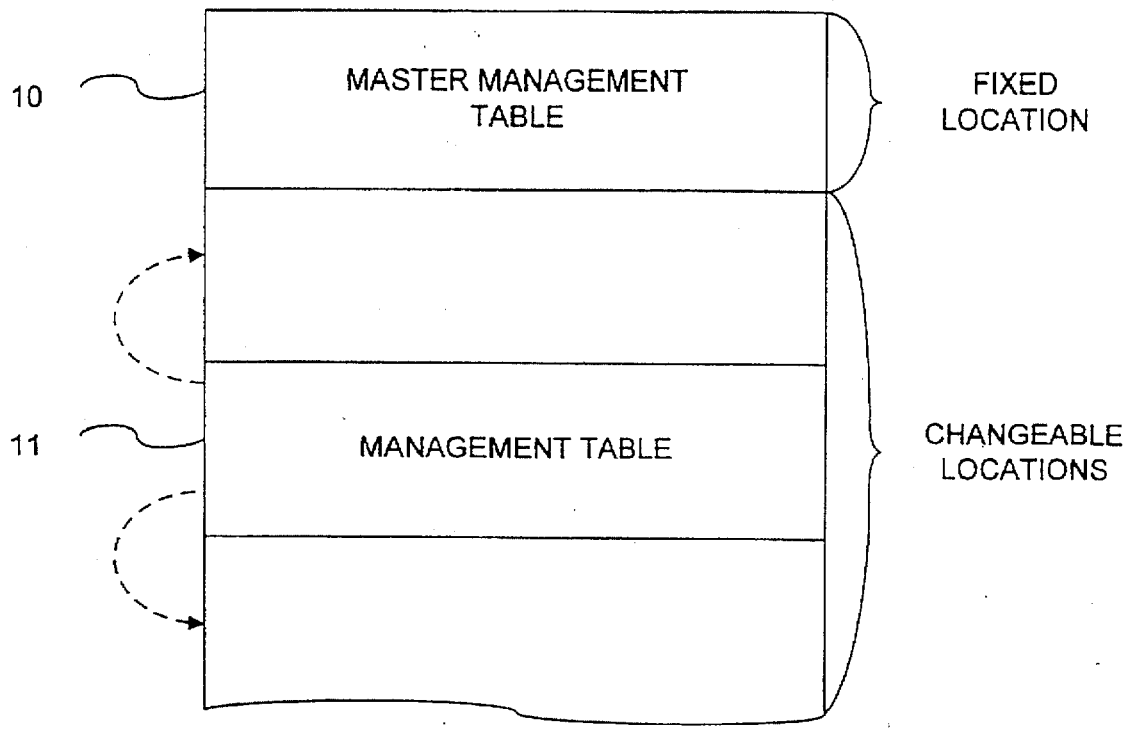

The master management table 10 is usually a fixed memory block (with physical address 00000), and stores the physical address (12345) of the memory block used for the management table 11. The management table 11 stores the management data that is composed of the physical addresses (memory addresses) of the memory blocks 12A through 12C corresponding to the logical addresses (referred to as system addresses) specified by the host system 3. As shown in FIG. 2B, the management table 11 stores the high-order data of the rewrite count data for each of the memory block 12A through 12C. As shown in FIG. 2C, the management table 11 is not fixed and its physical address is changed by the swapping process explained later. The memory blocks 12A through 12C, which each have a memory capacity of, for example, 512 bytes of data, store each piece of data on system addresses recognized by the host system 3.

The memory management controller 4 and read/write control circuit 5 are each composed mainly of a microprocessor.

A basic operation of a system thus constructed will be explained.

System Start-up Mode

At the time of system start-up, the memory management controller 4 of the unit 2 supplies to the read/write control circuit 5 an address for accessing the master management table 10. The read/write control circuit 5 reads from the master management table 10 the physical address (12345) of the management table 11 stored, and then transfers it to the memory management controller 4. The memory management controller 4 stores the contents of the master management table 10 as copy 9A in the RAM 9A.

Further, the memory management controller 4 supplies to the read/write control circuit 5 an address for accessing the management table 11 to read in the contents of the management table 11. The contents of the management table 11 are stored as copy 9B in the RAM 9. In the start-up mode, the memory management controller 4 secures the management information stored in the memory module 1 beforehand, and executes the memory management of the memory module 1.

Read Mode

When the host system 3 requests read access to a specified address, the memory management controller 4 refers to the copy 9B in the RAM 9 and converts the specified address (system address) into a physical address in the memory block. The read/write control circuit 5 accesses the memory block with the physical address from the memory management controller 4, and reads the stored data from the memory block. For example, as shown in FIG. 2A, the read/write control circuit 5 reads the data corresponding to the system address (00312) from the memory block 12A with the physical address (31415). The memory management controller 4 transfers the read-out data to the host system 3 via the interface controller 6 and data bus 3A.

Write Mode

When the host system 3 requests write access to a specified address, the memory management controller 4 refers to the copy 9B in the RAM 9 and converts the specified address into a physical address in the memory block as described earlier. Based on the physical address, the memory block corresponding to the specified address is accessed. The read/write control circuit 5 erases the contents of the memory block accessed, and then writes the new data transferred from the host system 3 into the memory block.

Swap Control Mode

In the present invention, the following swap control is executed in order to prevent rewrites from concentrating, in the write mode, on a particular memory block composed of flash EEPROMs whose number of rewrites is limited.

Figure 3:
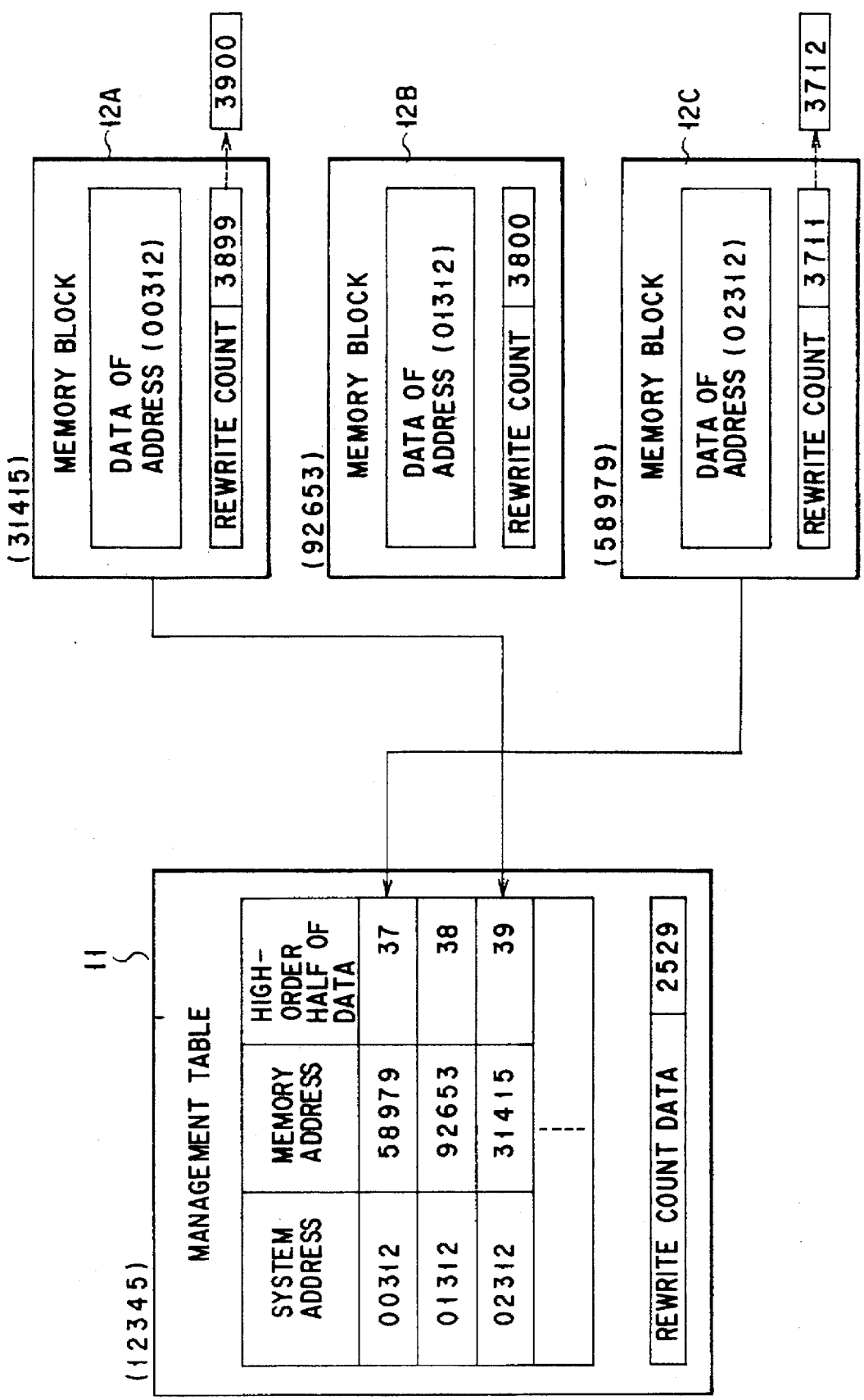
FIG. 3 is a block diagram showing a construction of a memory module in connection with the embodiment.

As shown in FIG. 3, the management table 11 and memory blocks 12A through 12C in the memory module 1 are each provided with memory areas for storing data on the number of rewrites. The rewrite count data is incremented each time a rewrite operation is performed on the memory block accessed. The increment process is executed by the memory management controller 4. The rewrite count data for each memory block is updated each time the rewrite operation takes place.

The management table 11 stores the high-order data (of two digits) of the rewrite count data for each of the memory blocks 12A through 12C as well as the rewrite count data of its own. The high-order data is not updated each time the write operation occurs, but is updated only when a carry (over two digits in this case) is generated in the rewrite count data.

On the assumption described above, when the host system 3 requests write access to a specified address as shown in FIG. 4, the memory management controller 4 accesses the memory block corresponding to the specified address as described in the write mode (steps S1 and S2). Specifically, the memory management controller 4 accesses and reads in, for example, the contents of the memory block 12B via the read/write control circuit 5. The memory management controller 4 pays attention to the rewrite count data (3800) in the stored contents, and judges whether or not a carry (a carry over two digits) takes place when the data is incremented (step S4). For the memory block 12B, increment raises the rewrite count data to (3801), causing no carry (NO at step S4). Therefore, as shown in FIG. 3, the high-order data (38) corresponding to the memory block 12B in the management table 11 does not change. In this way, when no carry takes place, the memory management controller 14 executes a normal write operation, thereby rewriting the data in the memory block 12B accessed to the specified data from the host system 3 (step 5). At this time, the memory management controller 4 updates the rewrite count data for the memory block 12B to (3801).

When the memory block corresponding to the specified address is the memory block 12A as shown in FIG. 3, increment raises the rewrite count data from (3899) to (3900), generating a carry (YES at step S4). In this case, the memory management controller 4 executes the swapping process of swapping memory blocks on the basis of the high-order data in the rewrite count data in the management table.

Specifically, the difference between the high-order data in the memory block 12A and the smallest of the high-order data in the other memory blocks is 2 or more, the memory block with the smallest high-order data is selected (step S6). Here, the memory block 12C with the physical address (58979) has the smallest high-order data (37). Thus, the memory management controller 4 executes the swapping of the memory block 12A and memory block 12C (step S7). By this swapping process, the memory management controller 4 rewrites the contents of the management table 11 as shown in FIG. 3 (step S8). At this time, the rewrite count data in the management table 11 is also incremented to update the rewrite count data in FIG. 2A from (2528) to (2529).

By the swapping process, data to be written into the system address (00312) is written into the memory block 12C. Before the writing, the data at the system address (02312) that is the contents of the memory block 12C is written into the memory block 12A. Therefore, the rewrite count data for each of the memory blocks 12A and 12C is incremented. With the updated management table 11 (see FIG. 3), when the system address (00312) is specified in the next write access, the memory block 12C is accessed. When the system address (02312) is specified, the memory block 12A is accessed.

Such a swapping process prevents rewrites from concentrating on a particular memory block (for example, 12A), with the result that the rewrite frequency (the high-order data of the rewrite count) of each memory block is equalized. As mentioned earlier, since there is a limit to the number of rewrites in flash EEPROMs constituting the memory blocks, if rewrites concentrate on a particular memory block, it will be impossible to rewrite the contents of the memory block. Thus, by equalizing the rewrite frequency of each memory block, the service life of the respective memory blocks can be lengthened.

Here, when the difference from the value of the smallest high-order data is less than 2, the swapping operation will not be executed, and the data is written, without any modification, into the memory block accessed. It is desirable that the high-order data (38) for the memory block 12C to be swapped should be incremented in the swapping process. This is because a memory block to be swapped will be selected repeatedly in the next swapping process if the value of the high-order data is small.

Although each of the memory blocks 12A through 12C stores all the digits of the rewrite count data, the data of the lower two digits may be stored instead. This introduces no problem in the swapping process, because the management table 11 stores the data of the upper two digits. With this configuration, the memory area for the rewrite count data for each of the memory blocks 12A to 12C can be reduced, so that it is possible to store the more of the other data.

Write Verify Process

Figure 6:
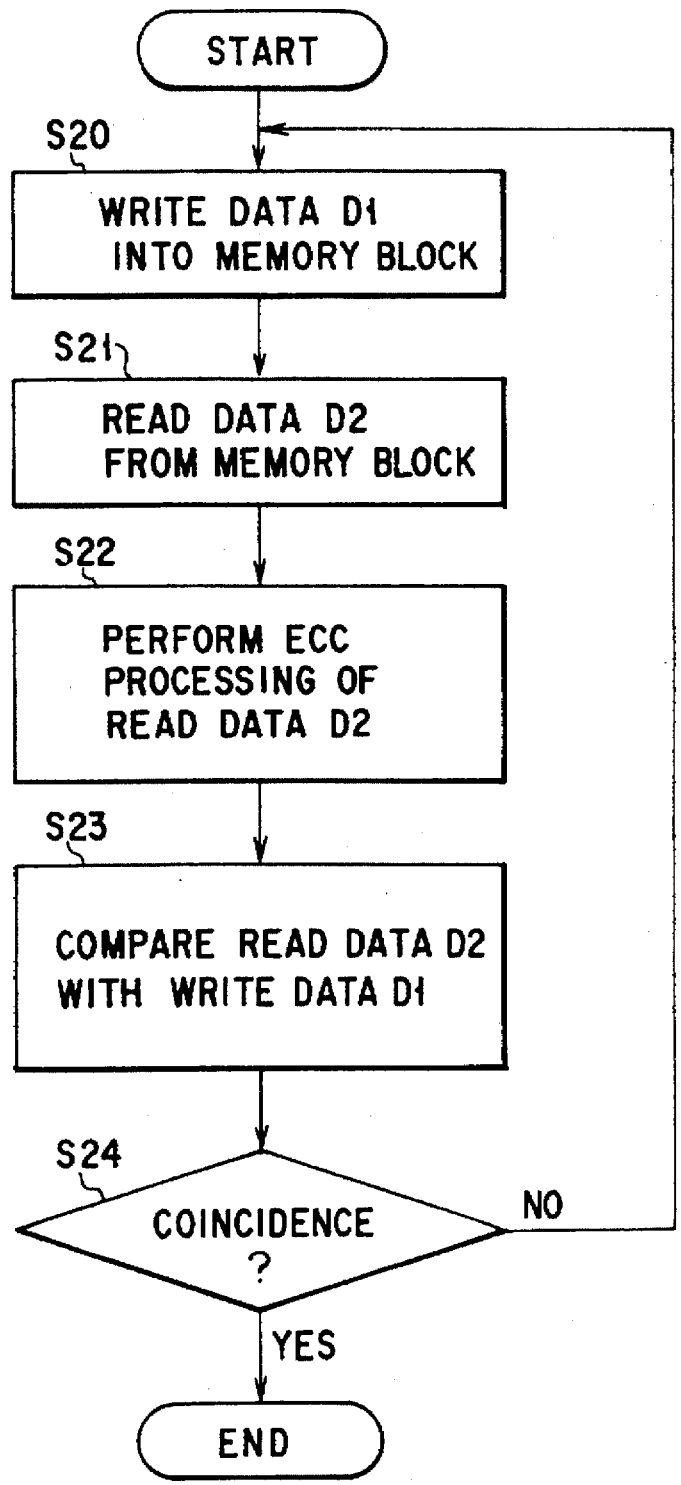

In the present invention, the read/write control circuit 5, using a previously prepared program, executes the write verify process of checking to see if writing is done properly, during the write operation in the write mode (see FIGS. 5 and 6).

As shown in FIG. 5, to meet the write access request from the host system 3, the read/write control circuit 5 writes specified data D1 into the memory block corresponding to the specified address (step S10). At this time, the read/write control circuit 5 reads data D2 (write data D1) from the memory block accessed (step S11). The read/write control circuit 5 compares the read-out data D2 with the original data D1 (step S12). If the result of comparison is agreement (YES at step S13), this means that the write operation is performed properly and the writing is terminated.

On the other hand, if the comparison result is disagreement (NO at step S13), the read/write control circuit senses the number of error bits in the read-out data D2 obtained from the comparison, the error distribution, and others. Based on the number of error bits, error distribution, and others, the ECC circuit 7 judges whether or not the error correction process can restore the read-out data D1 to the proper data (step S14). Specifically, it is Judged whether or not the error state of the data D2 meets the ECC conditions of the ECC circuit 7. If the conditions are met (YES at step S15), the read/write control circuit 5 will determine that the write operation is done properly and terminate the operation with this process, the number of write operations by the write verify process (the number of rewrites) can be reduced as long as the occurrence of errors is within a permitted limit, which prevents the write verify process from shortening the service life of the memory blocks. Here, in the Judgment based on the ECC conditions, the ECC circuit 7 may perform the ECC process directly on the data D2.

In another approach, the read/write control circuit 5 writes the data D1 from the host system 3, and reads the data D2 (write data D1) from the memory block accessed (steps S20 and S21), as shown in FIG. 6. This read-out data D2 is supplied to the ECC circuit 7. The ECC circuit 7 executes the ECC process, and then supplies the data D2 to the read/write control circuit 5 (step S22). The read/write control circuit 5 compares the data D2 subjected to the ECC process with the original data D1 (step S23). If the result of comparison is agreement (YES at step S24), this means that the write operation is done properly, and the writing is terminated.

On the other hand, if the comparison result is disagreement (NO at step S24), the read/write control circuit 5 will repeat the write operation on the data D1. At this time, the read/write control circuit 5 controls the power supply unit 8 so as to raise the write voltage gradually in a range free from excessive writing in the course of repeating the write verify process (see step S34 in FIG. 8).

Because of the properties of flash EEPROMs, the charge movement during the data writing varies with the applied voltage. Therefore, if the write voltage is variable, data can be written at higher voltages into cells difficult to write in, allowing for maximum use of the writing life. It can also be expected that the sum of repeated write times is shortened. As to voltage-raising steps, there is no problem as long as the voltage is raised stepwise, with each step being smaller than variations in the step-up unit for generating the write voltage Vpp built in the existing chips.

Figure 7:
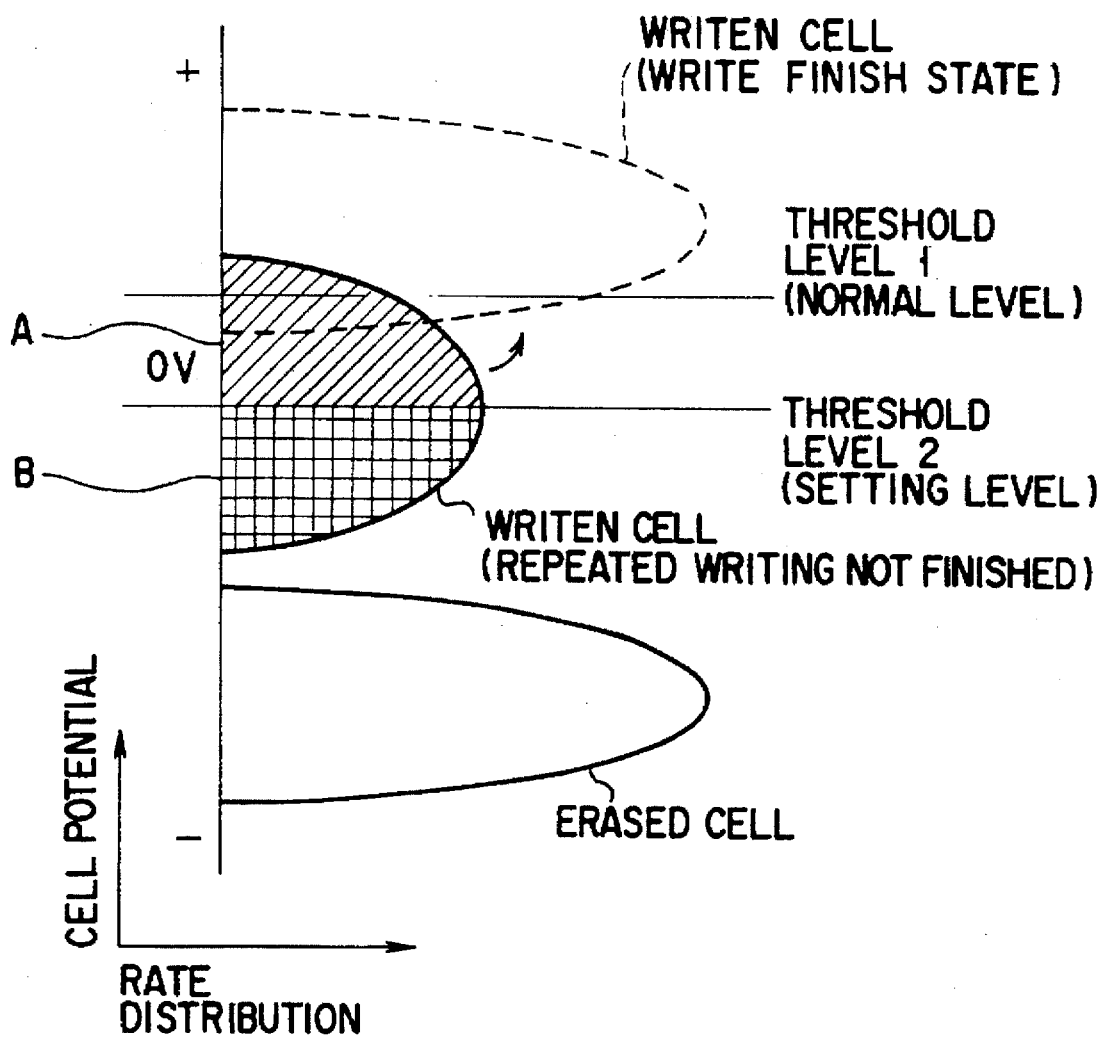
FIG. 7 is a diagram for explaining the write voltage control operation in connection with the embodiment.

For another system, by shifting the threshold voltage for the data read operation as shown in FIG. 7, according to the writing state of the cell, at the time of reading for the write verify process, the writing may be continued at the present write voltage for the cells judged to be about to finish being written into, whereas a higher voltage may be applied to write data into the cells judged to take some time to finish being written into. Namely, in FIG. 7, when a cell is in the writing state indicated by A, writing may be done at a normal voltage, and when a cell is in a state indicated by B, writing may be done at a higher voltage.

In threshold voltage setting during a normal data read operation, when data cannot be read out as expected (such as when an incurable error has been found in the ECC process), the threshold voltage is drifted for reading. This assures margins and 3-V logic levels. To realize a semiconductor disk device with 3-V external power supply specification, the reading margin may be obtained by the shift control of the threshold voltage or by the shift control combined with ECC, with the read voltage Vcc remaining at 3 V, or a step-up unit may be provided internally to convert the read voltage Vcc into the optimum value for data reading.

In writing data, it is possible to set the writing level based on this function. It is also possible to per form the ECC operation using the information obtained from the function. Specifically, after data that becomes unstable due to voltage drift is judged to have a chance to be erroneous, and stable data is judged to be correct data, the ECC operation is continued.

Here, the ECC circuit 7 performs an ECC operation on the write data and delivers the resulting data to the read/write control circuit 5. The ECC circuit 7 also performs an ECC operation on the read-out data to restore it to the original data. On the assumption that no error will not occur in the read operation when the flash EEPROM operates properly in the write verify operation, the method of including compensation data for an error place that appears as an unstable bit in the write operation may be considered instead of ECC that corrects an error in an unspecified place. Since ECC provides error signs of unidirectional error representation (such as a case where the erasing is complete but the writing is incomplete), this assures efficient operations differently from ordinary ECC.

Sensing the Use Rate of Memory Blocks

Figure 9:
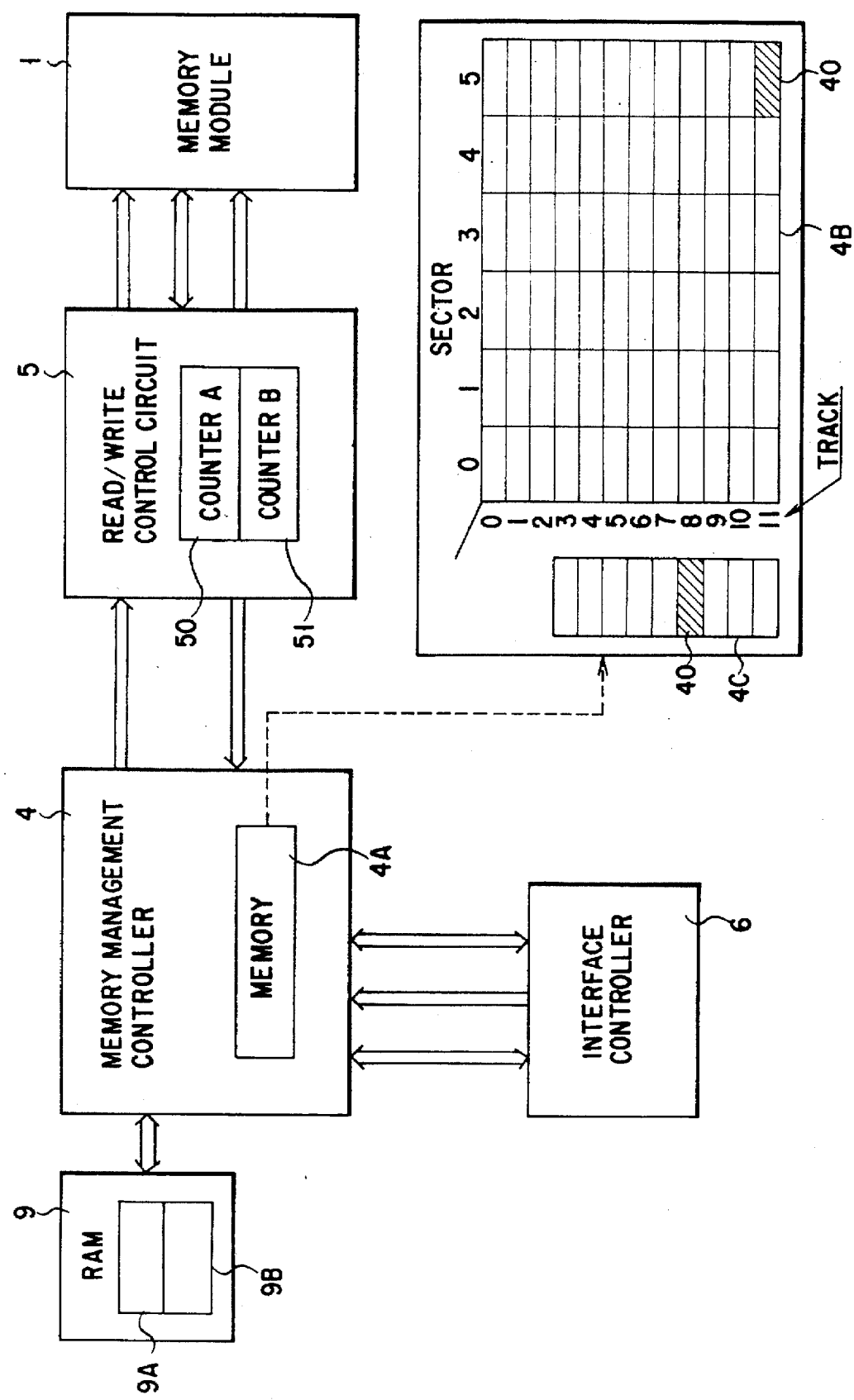
FIG. 9 is a block diagram for explaining the system of sensing the use rate of the memory module associated with the embodiment.

The memory management controller 4 is provided with a memory 4A that senses the use rate of each memory block (in other words, the consumption rate) and stores each consumption rate sensed, as shown in FIG. 9. The memory management controller 4 notifies the host system 3 of the sensed use rate via the interface controller 6.

The memory management controller 4 senses the use rate of each memory block on the basis of the high-order data of the rewrite count data for each memory block stored in the management table 11, the number of writes repeated until the write verify process is completed, and the number of error bits at the time when the write verify process has finished. The number of writes repeated is counted by a counter (A) 50 provided for the read/write control circuit 5. The number of error bits is counted by a counter (B) 51 provided for the read/write control circuit 5.

As shown in FIG. 9, when the memory module 1 is used as a disk unit similar to an HDD, the memory management controller 4 stores in the memory 4A a table 4B whose data storage addresses are composed of tracks and sectors. The table 4B is accessed by the host system 3. The memory management controller 4 stores the sensed use rate data 40 at a particular address in table 4B (here, sector 5 on track 11). By accessing the particular address, the host system 3 reads in the use rate data 40 and recognizes the use rate of the corresponding memory block.

As an interface with the host system 3, a system may be considered which transfers the use rate data 40 to the host system 3 by the command "Identify Drive" using, for example, an IDE interface. In this system, as shown FIG. 9, the memory 4A is provided with a sector buffer 4c, in which the use rate data 40 is stored as a piece of parameter information.

In the IDE interface system, the host system 3 accesses the register group in the HDD through program I/O. Each register is selected by address signals and chip select signals. A command register, one of the register group, is a register into which a command that actuates the HDD is written. The drive supports 13 types of commands, one of which is "Identify Drive." This command is for transferring the parameter information on the HDD to the host system. Once "Identify Drive" has been executed, the parameter information in the HDD is entered in the sector buffer.

Figure 10:
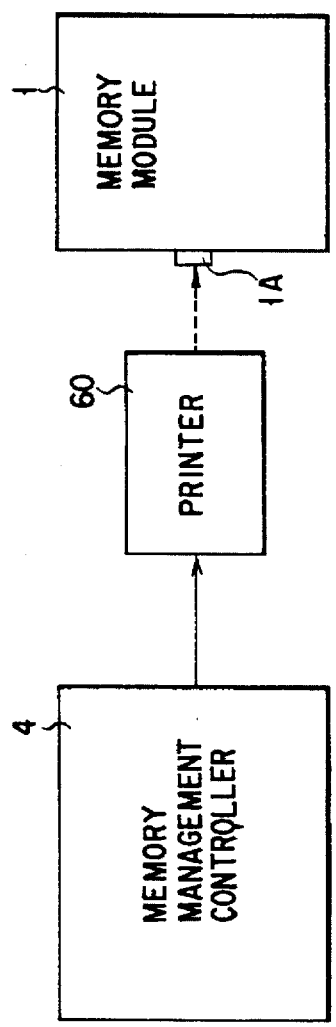
FIGS. 10 and 11 are block diagrams for explaining the system of reporting the use rate of the memory module associated with the embodiment.

As for a system that repeats the use rate of the memory block not to the host system but directly to the user, there is a system using a printer 60 as shown in FIG. 10. In this system, the memory management controller 4 supplies to the printer 60 the print signal corresponding to the sensed use rate of the memory block. The printer 60 is positioned so as to come into contact with the printing portion on the surface of the memory module 1. Heat-sensitive paper is placed on the printing portion 1A. The printer 60 prints the use rate data on heat-sensitive paper on the printing portion 1A according to the print signal from the memory management controller 4. This enables the user to know from the result the use rate of the memory block.

Figure 11:
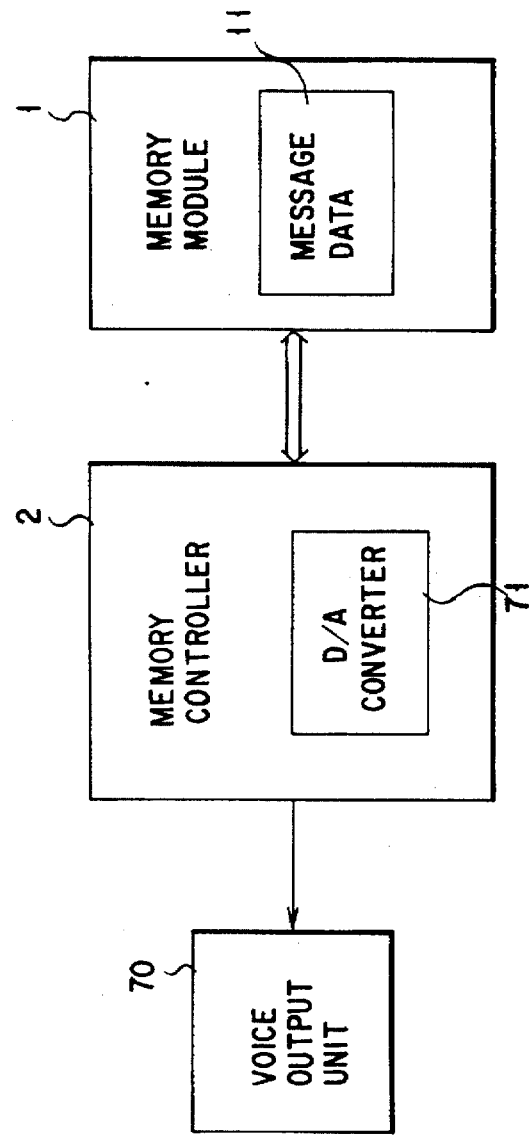

For a system that reports directly to the user, there is a voice output unit 70 as shown in FIG. 11. In this system, the memory management controller 4 stores message data in, for example, the management table 11 in the memory block 1. This message data is the voice information that informs the user of the use rate of the memory block sensed by the memory management controller 4.

The memory controller 2, which contains a D/A (digital-to-analog) converter 71, D/A converts the voice information read from the memory module 1 and sends the resulting signal to the voice output unit 70. The voice output unit 70, which is made up of an amplifier and a speaker, supplies the use rate of the memory block in voice.

Since, for example, the user may be surprised if the system starts to speak suddenly, the voice information is allowed to include information that first sounds a buzzer or the like. Further, because the user cannot understand what has been said if the system spoke without notice, the voice information is allowed to contain information that identifies itself as a semiconductor disk device being a sound source. In case failure, information on the telephone number of the service of a center and others is included in the voice information. A voice is produced in such a manner that when the use still continues even after an alarm has been given in voice, another alarm is raised in every write operation (especially when the writing intervals are short, an alarm is given in regular intervals of several seconds), that the contents of a voice are varied with the remaining life, or that the interval between alarms is changed.

Write Inhibit Mode

Figure 12:
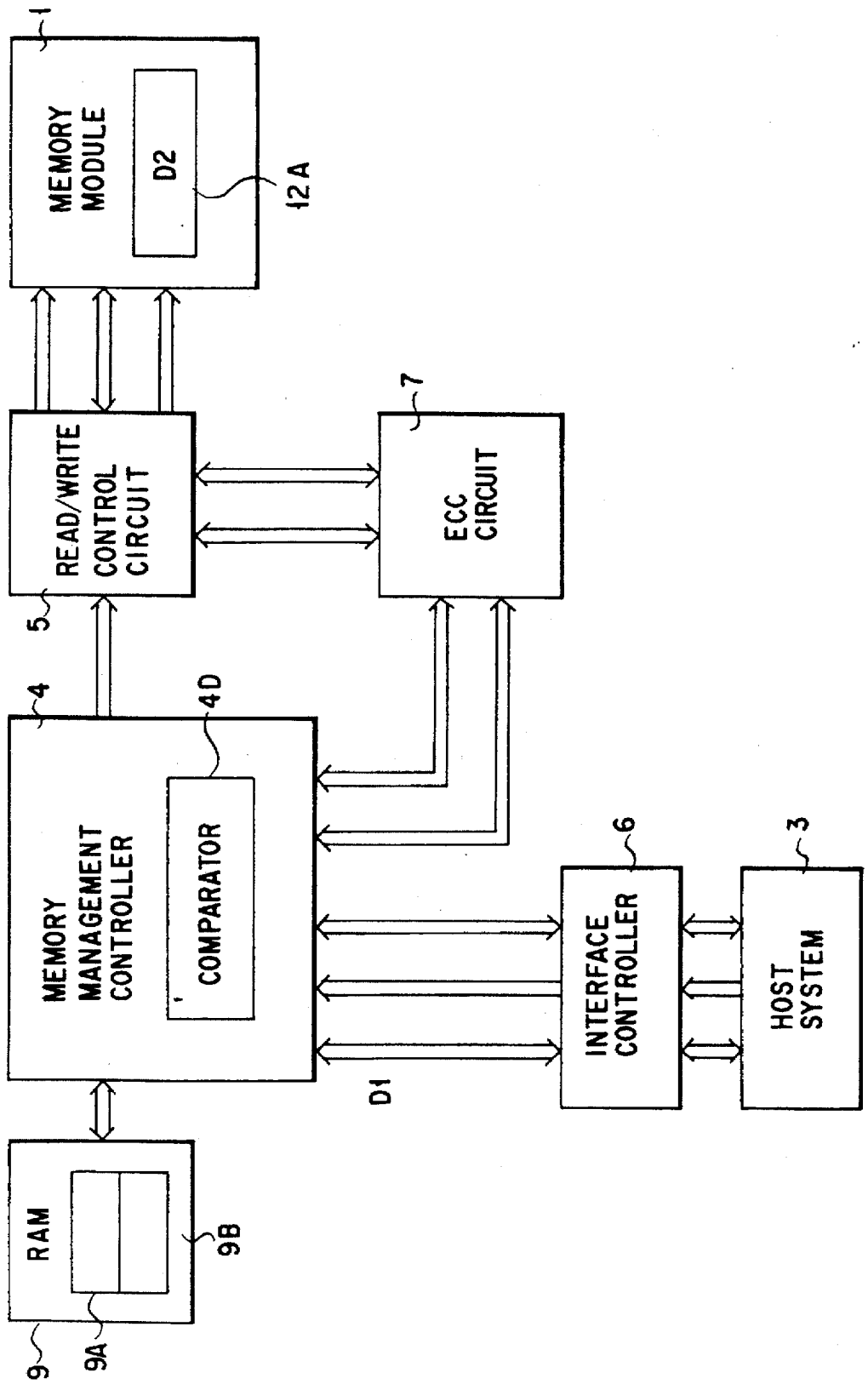
FIG. 12 is a block diagram for explaining the write inhibit mode associated with the embodiment.

As shown in FIG. 12, the memory management controller 4, which contains a comparator 4D, has the function of comparing the write data at the specified address with the recorded data already existing at the same address at the time of write access by the host system 3. When, for example, the memory block 12A in the memory module 1 is write-accessed by the specified address from the host system 1, the memory management controller 4 reads out the data D2 already stored in the memory block 12A. The comparator 4D of the memory management controller 4 compares the read-out data D2 with the write data D1 from the host system 3. If the result of the comparison is disagreement, the memory management controller 4 executes the write mode to perform the operation of writing the write data D1 into the memory block 12A.

On the other hand, if the comparison result is agreement, the memory management controller 4 judges that the address being accessed has already stored the data D2 identical with the specified data D1, and inhibits an actual write operation. Specifically, the memory management controller 4 terminates the write operation without supplying the physical address corresponding to the logical address being accessed to the read/write control circuit 5 (reporting the completion of writing to the host system 3). Therefore, when the data identical with the data being write-accessed has already written, the write operation can be omitted, with the result that the number of rewrites for the memory block can be reduced. Such a function of inhibiting the writing of the same write data is called a self-compare write function. The self-compare write function is selected as desired by commands or the like from the host system 3.

Alternative Memory Block

As shown in FIG. 13, the memory module 1 is provided with a plurality of alternative memory blocks 80A through 80C. Using those alternative memory blocks 80A through 80C, the memory management controller 4 executes a substituting process as shown in FIG. 14.

As shown in FIG. 14, when the host system 3 requests write access to a specified address, the memory management controller 4 accesses the memory block corresponding to the specified address (steps S40 and S41). The memory management controller 4 erases the stored data in, for example, the memory block 12A accessed, via the read/write control circuit 5 (step S42). In erasing the data or during the write verify operation, if an error takes place in the memory block 12A, the memory management controller 4 will execute the process of switching the memory block 12A to, for example, an alternative memory block 80A (YES at step S43, and step S45). Specifically, the contents of the management table 11 are rewritten so that the physical address of the memory block 12A corresponding to the system-address (logical address) from the host system 3 may be converted into the physical address of the alternative memory block 80A. This eliminates the system address corresponding to the physical address of the memory block 12A in which an error occurred.

Based on the management table 11, the read/write control circuit 5 writes the write data from the host system 3 into the alternative memory block 80A (step S46). On the other hand, when no error has occurred, the read/write control circuit 5 writes specified write data into the memory block 12A accessed (NO at step S43, and step S44).

With such a substituting process using the alternative memory blocks 80A through 80C, the write data from the host system 3 can be protected when a writing error has occurred in the memory block accessed in the write mode, by writing the data in the alternative memory block. One of the causes of writing errors may be a case where a memory block whose number of rewrites has exceeded its limit is accessed.

There is a system which has a substituting sequence of the alternative memory blocks 80A through 80C. Of those alternative memory blocks 80A through 80C, the alternative memory block 80C with the lowest substituting priority is allowed to store message information that indicates the life limit of the memory module 1. When the number of remaining memory blocks decreases as a result of substituting processes, that is, when the memory module 1 comes closer to its life limit, the message information is read from the memory block 80C to notify the user of the fact. The notification is made in a voice as shown in FIG. 11. After the message information has been reported to the user, the alternative memory block 80C is used as a normal alternative memory block.

A Plurality of Management Tables

As shown in FIG. 15, the memory module 1 may have a plurality of management tables 11A through 11C. Each of management tables 11A through 11C stores management information that manages a plurality of corresponding memory blocks. The master management table 10 stores the physical address of each of management tables 11A through 11C.

In such a system, when physical addresses are allocated to the respective memory blocks on the basis of the system addresses in the host system 3, a management table with a system address frequently accessed undergoes a swapping operation more often. This raises the problem that the number of rewrites (rewrite frequency) differs greatly from one memory block to another in each of the management tables 11A through 11C. To solve such a problem, each of the management tables 11A through 11C stores the management information allocated with the system address in the host system 3 on the basis of the physical address of each of the memory blocks. That is, the physical address is fixed and the system address is made variable with this system, a swapping process can be carried out so as to equalize the access frequency for the physical address of each memory block.

In the system start-up, the memory management controller 4 copies the contents of each of management tables 11A through 11C into the RAM 9. At this time, the contents of each of management tables 11A through 11C are sorted, and converted into those based on the system addresses (logical addresses) in the host system 3. This is because the retrieval of physical addresses to be accessed becomes difficult if the operation is based on the physical addresses when the system addresses are supplied from the host system 3.

The Shape and Detachable Mechanism of Memory Module 1

Presently, a typical thickness of notebook-type personal computers is approximately 44 mm. Some are as thin as 27 mm in thickness. Except for this, most personal computers of this type have a thickness of nearly 44 mm, although similar ones have a thickness of nearly 39 mm at a minimum. HDDs are being made more compact and 1.8-inch models are available with a width of nearly 50.8 mm to 54 mm. Therefore, for 1.8-inch HDDs, it is impossible to install the HDD in a notebook-type personal computer so that the width of the HDD may fit in the thickness of the notebook-type personal computer.

In the case of a silicon disk unit to which the present invention has been applied, however, it is possible to install an HDD with its width aligned with the thickness of a notebook-type personal computer. In this case, to assure marketability, it is necessary to take into account the thinnest of similar models at present, whose thickness is as thin as 39 mm.

Figure 16A:
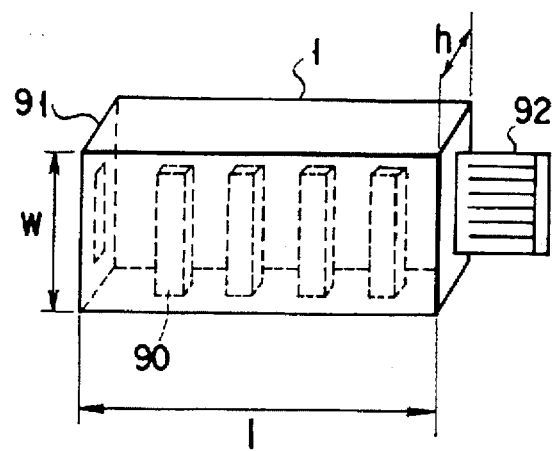
FIGS. 16A, 16B, 17A, 17B, 18A, and 18B are each perspective views showing the shapes and detachable mechanisms of the memory module associated with the embodiment.
Figure 16B:
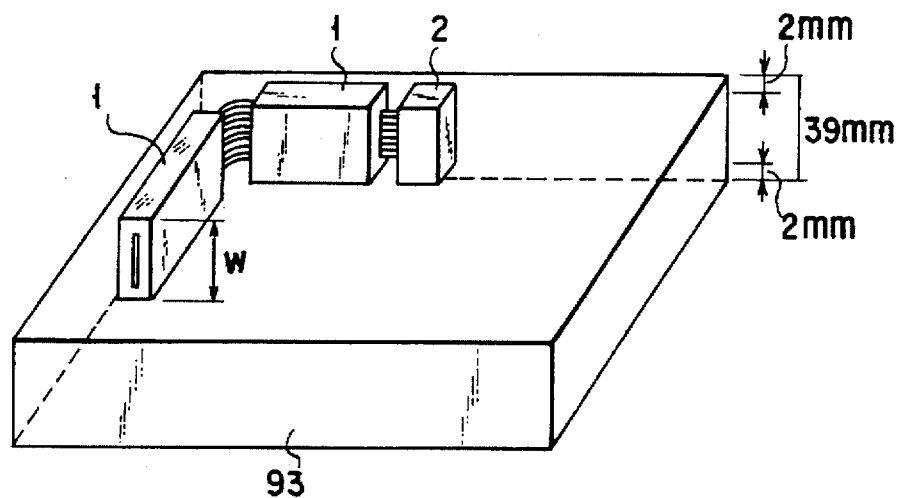

In this case, when a disk unit of the present invention is installed, the personal computer requires 1.5 mm for the outer casing and 0.5 mm for clearance, that is, a total of 2 mm on each side. Therefore, as shown in FIGS. 16A and 16B, to fit the unit in a thickness of 39 mm, the width w of the disk unit (the width of the memory module 1) must be designed to be smaller than 39−2−2=35 mm. Installing the unit this way provides the advantage of securing an area for the main board on the personal computer side. In the figure, reference character l indicates a length and h denotes a height (a thickness).

As shown in FIG. 16A, a plurality of chips (flash EEPROMs) 90 constituting the memory module 1 are housed in a case 91. Each chip 90 is detachably installed in a computer body (system body) 93 by means of a flexible cable 92 attached to the case 91, as shown in FIG. 16B. Inside the computer body 93, the controller 2 is connected to the memory module 1 to form a disk unit to which the present invention is applied. In this case, the memory module 1 is placed in series with an additional one with their width aligned with the thickness of the system body 93.

Figure 17A:
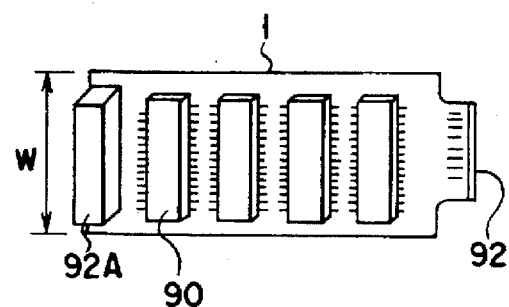
Figure 17B:
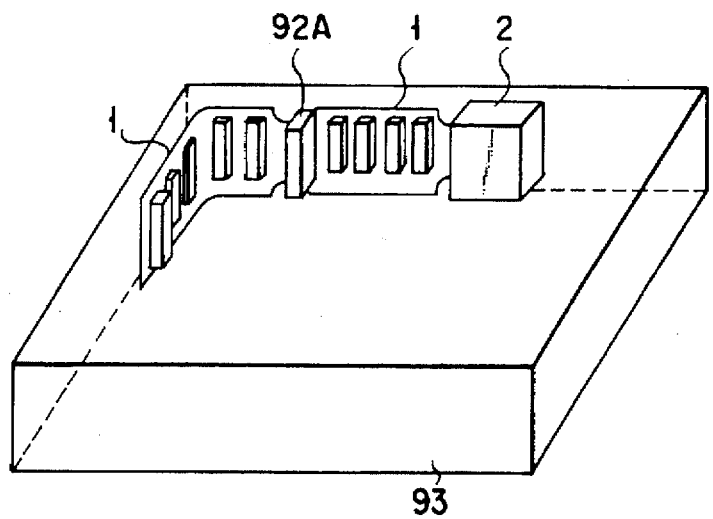

As shown in FIGS. 17A and 17B, the memory module 1 may be installed detachably in the system body 93 by means of the flexible cable 92 and a connector 92A. In this case, the memory module is also arranged in series with an additional one with their width aligned with the thickness of the system body 93.

Figure 18A:
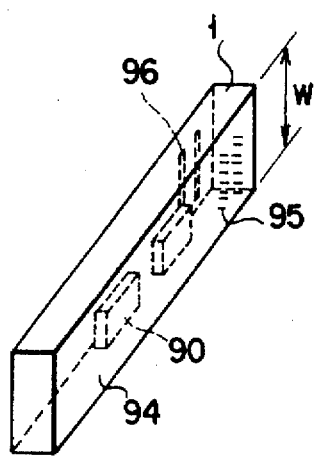
Figure 18B:
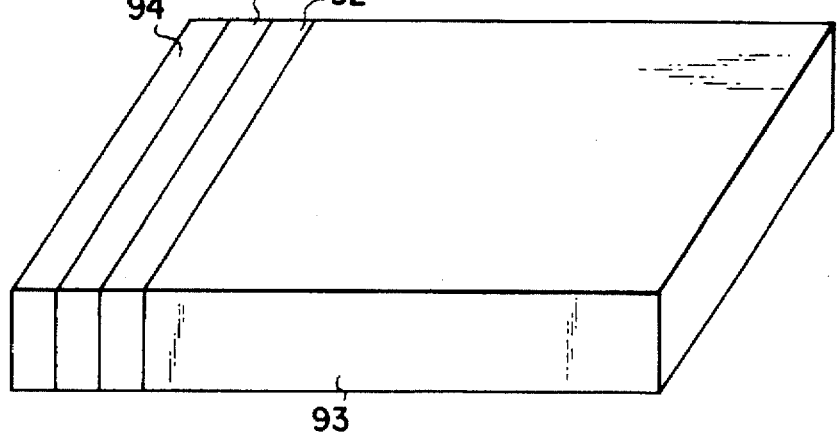

As shown in FIG. 18A, the memory module 1 is composed of a memory pack 94 containing a plurality of chips 90. The memory pack 94 is provided with contact pins 95 and pin receptacle electrodes 96. As shown in FIG. 18B, each memory pack 94 may be installed detachably in the system body 93 via contact pins 95 and pin receptacle electrodes. In this case, each memory pack 94 is externally added to the system body 93. With such an externally added arrangement, the size of the system body 93 itself can be made smaller than the aforementioned system where the memory module 1 is housed in the system body. Since another memory module 1 can be added as desired and removed easily, it is easy to replace the memory module 1, depending on the consumption state of the memory module 1.

The system body 93 is, for example, a laptop personal computer as shown in FIG. 19. Installed in the system body 93 is a silicon disk unit 100 containing the memory module 1 and the memory controller 2.

With the present invention, it is possible to realize a silicon disk unit that allows-access by the host system 3 in a similar manner to HDDs, without paying attention to the difference between flash EEPROMs and HDDs.

Further, the following technical effects can be obtained. Since the consumption state of the flash EEPROMs constituting the memory module is sensed and the state is reported to the host system or the user, this provides for a case where the number of rewrites of the flash EEPROMs has reached its limit as they are used, and writing is finally impossible. This prevents the user from being embarrassed by sudden incapability of writing. Because the memory module 1 has the management table 11 in it, the host system 3 can access the flash EEPROMs in a similar manner to ordinary HDDs without paying attention to the difference between those types of memory elements. Since the memory modules are constructed so as to fit in with the thickness of the system body in a detachable and expandable manner, this achieves the optimum unit dimensions in terms of system installation, being free from the specifications of existing HDDs.

The controller 2 reads the management information from the memory module 1 at the system start-up, and copies the read-out information in the RAM 9. This allows the memory system to be automatically constructed at the time of the system start-up when memory modules 1 are changed. In other Words, when the changing of memory modules 1 is done, the controller 2 realizes a system configuration according to the management information held in the memory module 1 at the time of the start-up of the system power supply.

The management table 11 prevents accesses from concentrating on a particular memory block in the memory module 1, thereby equalizing the use frequency for each memory block. The self-compare write function can inhibit the same data as the existing data from being written at the same address. Therefore, it is possible not only to prevent useless writing to improve the processing speed, but also to lengthen the service life of the memory module.

Further, the swapping process equalizes the use frequency of each memory block. This prevents the memory module from deteriorating partially, thereby lengthening its service life. The write verify process can save the address even if an error has occurred during the data write operation, with the result that the service life of the memory module can be made longer. Since the voltage for data writing is allowed to vary with the writing state of each cell, a cell difficult to write data can be written into at a higher voltage, thereby making use of the writing life to a maximum. By specifying a particular address in the memory module or a particular command in a particular interface, the consumption state of the memory module is read out and then supplied to the host system, which allows the host system to Judge the life of the memory module.

Instead of a memory block in which an error has taken place, an alternative memory block is used. This substituting process saves the data even if an unusable memory area (physical address) appears in a part of the memory module, with the result that the service life of the memory module is made longer.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A storage system including a plurality of memory block means, said memory block means comprising rewritable nonvolatile memory devices arranged in units of in-unison erase blocks, the storage system comprising:
  a plurality of first memory block means for reading and writing by a host system, each of said first memory block means having a changing location in said storage system;
  a second memory block means for storing address conversion information for translating accesses to each of said first memory block means, the second memory block means having a changing location in said storage system; and
  a third memory block means for storing an address of the second memory block means, the third memory block means having a fixed location in said storage system.

2. The storage system of claim 1, further including
  memory controller means for converting a logical address accessed by the host system into a physical address for specifying one of said first memory block means to be accessed based on said address conversion information, and for performing memory control in a manner that reads data at the physical address from said one of said first memory block means of said storage system, or writes specified data in said one of said first memory block means corresponding to the physical address.

3. The storage system of claim 2, wherein the second memory block means includes an address allocation table having said address conversion information, and said memory controller means includes means for accessing the address allocation table to convert the logical address into the physical address.

4. The storage system of claim 1, wherein the rewritable nonvolatile memory devices comprise flash electrically erasable and programmable ROMs.

5. The storage system of claim 1, wherein the second memory block means includes at least two units of in-unison erase blocks.

6. A storage system having a plurality of memory blocks, each of said memory blocks comprising rewritable nonvolatile memory devices arranged in units of in-unison erase blocks, the storage system comprising:
  a plurality of first memory blocks for storing data for reading and writing by a host system, each of said first memory blocks storing write count data, the write count data comprising low-order part data of write frequency information indicating a frequency that data is rewritten in a corresponding one of the first memory blocks; and
  a second memory block for storing master management information including high-order part data of the write frequency information for all of the first memory blocks, the high-order part data being written less frequently than the low-order part data.

7. The storage system of claim 6, further comprising
  controller means for controlling access to the storage system, said controller means increasing the write count data stored in one of the first memory blocks when a write operation is requested to the one of the first memory blocks.

8. The storage system of claim 7, wherein the controller means comprises
  means for updating the high-order part data of the write frequency information corresponding to the one of the first memory blocks only if the write count data is equal to a predetermined value when said controller means increases the write count data.

9. The storage system of claim 8, further comprising
  means for swapping contents of the one first memory block with another first memory block when the high-order part data corresponding to the one first memory block after being increased by the updating means differs from the high-order part data of the other first memory block by more than a predetermined amount.

10. The storage system of claim 6, wherein the second memory block has an address location that changes within the storage system; and
  wherein the storage system further comprises
  a third memory block for storing the address location of the second memory block, the third memory block having a fixed predetermined address location within the storage system.

11. A storage system including a plurality of memory block means, each of said memory block means comprising rewritable nonvolatile memory devices arranged in units of in-unison erase blocks, the storage system comprising:

a plurality of first memory block means for storing user's data and address conversion information for translating accesses to said user's data, the first memory block means having a changing location in said storage system; and a second memory block means for storing an address of the address conversion information, the second memory block means having a fixed location in said storage system.

12. A storage system including a plurality of memory block means, each of said memory block means comprising rewritable nonvolatile memory devices arranged in units of in-unison erase blocks, the storage system comprising:

a plurality of first memory block means including a second memory block means for storing user's data and a third memory block means for storing address conversion information for translating accesses to said user's data, the first memory block means having a changing location in said storage system; and a fourth memory block means for storing an address of the address conversion information, the fourth memory block means having a fixed location in said storage system.

13. The storage system of claim 1, wherein each of the first memory block means stores write count data indicating a number of times data is rewritten in the corresponding first memory block means; and wherein the storage system further comprises means for increasing the write count data of one of the first memory block means when data is rewritten in the one first memory block means.

14. The storage system of claim 13, wherein the second memory block means stores high-order part data of the write count data stored in the first memory block means.

15. The storage system of claim 14, further comprising means for swapping contents of the one first memory block means with another first memory block means when the high-order part data of the one first memory block means and the high-order part data of the other first memory block means differ by more than a predetermined amount.

16. A memory having a plurality of memory blocks, comprising:

a plurality of first memory blocks for storing data, the first memory blocks having address locations that change within the memory;

a plurality of second memory blocks for storing address information representing the address locations of the first memory blocks, the second memory blocks having address locations that change within the memory; and a third memory block for storing address information representing the address locations of the second memory blocks, the third memory block having a location that is fixed within the memory.

17. The storage system of claim 16, wherein the first memory blocks include count data indicating a number of times each first memory block has been written into or erased.

18. The storage system of claim 17, wherein the second memory blocks include count data indicating a number of times each second memory block has been written into or erased.

19. The storage system of claim 16, wherein the second memory blocks include count data indicating a number of times each second memory block has been written into or erased.

20. A storage system comprising:

a plurality of first memory blocks for reading and writing data by a host system;

a plurality of second memory blocks for storing address tables containing address locations of the first memory blocks, each of the second memory blocks storing count data indicating a number of times the corresponding address table has been written into or erased, the second memory blocks having address locations that change within the storage system; and a third memory block for storing an address table containing the address locations of the second memory blocks, the third memory block having an address location that is fixed within the storage system.

21. The storage system of claim 20, further comprising means for increasing the count data stored in one of the second memory blocks when an address location in a corresponding one of the address tables is changed.

22. The storage system of claim 21, further comprising means for reading the count data stored in the second memory blocks after the increasing means increases the write count data in the one second memory block.

23. The storage system of claim 22, further comprising means for selecting another one of the second memory blocks having count data that differs from the count data of the one second memory block by more than a predetermined amount; and means for transferring contents of the one second memory block to the selected second memory block.

24. A method for accessing a memory block of a memory device, the memory device including a plurality of first memory blocks having changing locations within the memory device and a second memory block having a fixed location within the memory device, the method comprising the steps of:

reading a current address location for one of the first memory blocks from a first table stored in the second memory block at a predetermined fixed address in the memory device;

reading a current address location for another one of the first memory blocks from a second table stored in the one first memory block at the address location from the first memory table; and accessing the other first memory block at the address location read from the second table.

25. The method of claim 24, wherein the accessing step comprises the substep of writing data in the other first memory block at the address location read from the second table.

26. The method of claim 25, wherein each of the first memory blocks store write count data indicating a number of times a corresponding one of the first memory blocks has been written; and wherein the method further comprises the step of increasing the write count data stored in the other first memory block.

27. The method of claim 26, wherein the one first memory block stores high-order count data corresponding to upper bits of the write count data stored in the other first memory block; and wherein the method further comprises the step of increasing the high-order count data stored in the one first memory block when the write count data reaches a predetermined number.

28. The method of claim 27, further comprising the step of swapping contents of the other first memory block with contents of yet another first memory block when the high-order count data stored in the one first memory block exceeds a specified value.

29. A computer system comprising:

a main processor;

a memory controller connected to the main processor; and a memory system, connected to and controlled by the memory controller, including a plurality of memory block means, the memory block means comprising a plurality of first memory block means for reading and writing by the main processor via the memory controller, each of the first memory block means having a changing location within the memory system, a second memory block means for storing address conversion information for translating accesses to each of the first memory block means by the main processor, the second memory block means having a changing location within the memory system, and a third memory block means for storing an address of the second memory block means, the third memory block means having a fixed location in the memory system.

30. A method for tracking a rewrite history of a plurality of first blocks and a second block of a memory device, comprising the steps of:

storing first rewrite count data in each of the first blocks, the first rewrite count data indicating a number of times a corresponding one of the first blocks has been written into or erased;

storing a portion of the first rewrite count data in the second block;

updating the first rewrite count data in one of the first blocks when performing one of a write operation and an erase operation in the one first block; and updating the portion of the first rewrite count data in the second block when the first rewrite count data in the one first block exceeds a predetermined number.

31. The method of claim 30, further comprising storing second rewrite count data in the second block, the second rewrite count data indicating a number of times the second block has been written into or erased.

32. The method of claim 31, further comprising updating the second rewrite count data in the second block when performing one of a write operation and an erase operation in the second block.

33. A method for leveling out a number of writes and erases among a plurality of memory blocks of a storage device, the storage device having a plurality of first memory blocks and at least one second memory block, the method comprising the steps of:

storing count data in each of the first memory blocks, the count data indicating a number of times a corresponding first memory block has been written into or erased;

storing high-order count data, corresponding to high-order bits of the count data, for each of the first memory blocks in the second memory block;

reading the high-order count data from the second memory block;

comparing the high-order count data for each of the first memory blocks; and transferring contents of one of the first memory blocks to another first memory block when the high-order count data corresponding to the one first memory block is at least a predetermined amount larger than the high-order count data corresponding to the other first memory block.

* * * * *